United States Patent
Keene et al.

(10) Patent No.: US 12,136,710 B2
(45) Date of Patent: Nov. 5, 2024

(54) ALGORITHM-OPTIMIZED VOLTAGE AND/OR CURRENT WINDOWS FOR LITHIUM-SILICON BATTERIES

(71) Applicant: ENEVATE CORPORATION, Irvine, CA (US)

(72) Inventors: Samuel Keene, Irvine, CA (US); Benjamin Yong Park, Mission Viejo, CA (US)

(73) Assignee: ENEVATE CORPORATION, Irvine, CA (US)

( * ) Notice: Subject to any disclaimer, the term of this patent is extended or adjusted under 35 U.S.C. 154(b) by 0 days.

(21) Appl. No.: 17/548,830

(22) Filed: Dec. 13, 2021

(65) Prior Publication Data
US 2023/0187716 A1    Jun. 15, 2023

(51) Int. Cl.
*H01M 10/48* (2006.01)
*G01R 31/3835* (2019.01)
*G06N 3/02* (2006.01)
*G06N 20/00* (2019.01)
*H01M 10/0525* (2010.01)

(52) U.S. Cl.
CPC ........ *H01M 10/48* (2013.01); *G01R 31/3835* (2019.01); *G06N 3/02* (2013.01); *G06N 20/00* (2019.01); *H01M 10/0525* (2013.01)

(58) Field of Classification Search
None
See application file for complete search history.

(56) References Cited

U.S. PATENT DOCUMENTS

| | | | | |
|---|---|---|---|---|
| 9,500,713 | B1* | 11/2016 | Ghantous | G01R 31/3835 |
| 2009/0061325 | A1* | 3/2009 | Odani | H01M 4/387 |
| | | | | 429/231.95 |
| 2009/0297951 | A1* | 12/2009 | Katsura | C23C 14/0635 |
| | | | | 427/78 |

(Continued)

OTHER PUBLICATIONS

Jichao Hong, et al., "Online accurate state of health estimation for battery systems on real-world electric vehicles with variable driving conditions considered", Journal of Cleaner Production, Jan. 6, 2021, 16 pages.

(Continued)

*Primary Examiner* — Brent A. Fairbanks
(74) *Attorney, Agent, or Firm* — McAndrews, Held & Malloy, Ltd.

(57) ABSTRACT

Systems and methods are provided for algorithm-optimized voltage and/or current windows for lithium-silicon batteries. A lithium-ion cell may be managed, with the managing including controlling voltage and/or current of the lithium-ion cell using an enhanced algorithm. The controlling includes adjusting voltage and/or current limits applied during one or both of charging and discharging of the lithium-ion cell, and the enhanced algorithm is configured to control a voltage range and/or a current range of the lithium-ion cell to maximize a combination of one or more variable associated with the lithium-ion cell including one or more of cycle life, energy density, cumulative capacity before end of life, and cumulative energy before end of life. The lithium-ion cell may be a silicon-dominant cell having a silicon-dominant anode with silicon >50% of active material of the anode, and the enhanced algorithm may be configured based on characteristic(s) unique to silicon-dominant cells.

23 Claims, 7 Drawing Sheets

(56) References Cited

U.S. PATENT DOCUMENTS

| | | | | |
|---|---|---|---|---|
| 2011/0143201 | A1* | 6/2011 | Takada | H01M 4/70 |
| | | | | 429/233 |
| 2014/0333317 | A1* | 11/2014 | Frost | G01R 31/3842 |
| | | | | 324/430 |
| 2016/0116548 | A1* | 4/2016 | Ghantous | H01M 10/425 |
| | | | | 702/63 |
| 2016/0202324 | A1* | 7/2016 | Biletska | B60L 58/12 |
| | | | | 702/63 |
| 2017/0242077 | A1* | 8/2017 | Guo | H01M 10/48 |
| 2018/0198161 | A1* | 7/2018 | Krasovitsky | H02J 7/007182 |
| 2018/0301749 | A1* | 10/2018 | Krasovitsky | H01M 10/0525 |
| 2019/0123574 | A1* | 4/2019 | Jung | B60L 58/12 |
| 2020/0088797 | A1* | 3/2020 | Takahashi | H01M 4/386 |
| 2021/0148987 | A1* | 5/2021 | Ghantous | G01R 31/392 |
| 2021/0247451 | A1* | 8/2021 | Hong | G01R 31/389 |
| 2022/0065943 | A1* | 3/2022 | Ott | H02J 7/0013 |

OTHER PUBLICATIONS

Xiong Feng, et al., "State-of-charge estimation of lithium-ion battery based on clockwork recurrent neural network", Energy, Jul. 3, 2021, 10 pages.

Yihuan Li, et al., "Lithium-ion battery capacity estimation—A pruned convolutional neural network approach assisted with transfer learning", Applied Energy, Jan. 4, 2021, 13 pages.

Kodjo S.R. Mawonou, Akram Eddahech, Didier Dumur, Dominique Beauvois, Emmanuel Godoy. "State-of-health estimators coupled to a random forest approach for lithium-ion battery aging factor ranking", Journal of Power Sources, Elsevier, Jan. 10, 2021, 28 pages.

* cited by examiner

ALGORITHM-OPTIMIZED VOLTAGE AND/OR CURRENT WINDOWS FOR LITHIUM-SILICON BATTERIES

CROSS-REFERENCE TO RELATED APPLICATIONS/INCORPORATION BY REFERENCE

This patent application also makes reference to:
U.S. patent application Ser. No. 17/548,845, filed on Dec. 13, 2021; and
U.S. patent application Ser. No. 17/548,851, filed on Dec. 13, 2021.

Each of the above identified applications is hereby incorporated herein by reference in its entirety.

TECHNICAL FIELD

Aspects of the present disclosure relate to energy generation and storage. More specifically, certain implementations of the present disclosure relate to methods and systems for use of algorithm-optimized voltage and/or current windows for lithium-silicon batteries.

BACKGROUND

Various issues may exist with conventional battery technologies. In this regard, conventional systems and methods, if any existed, for designing and producing batteries or components thereof may be costly, cumbersome, and/or inefficient—e.g., they may be complex and/or time consuming to implement, and may limit battery lifetime.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for algorithm-optimized voltage and/or current windows for lithium-silicon batteries, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

Figure 1A:
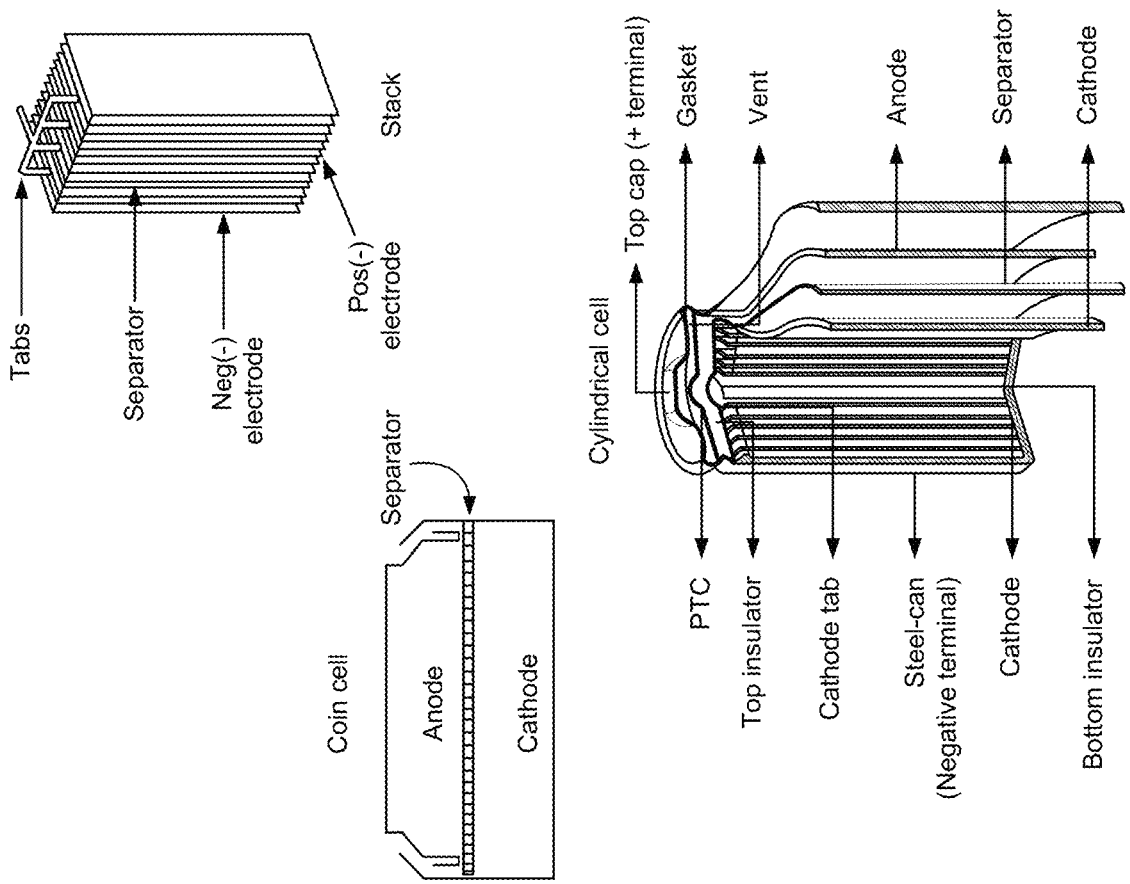
FIG. 1A is a block diagram of an example battery.
Figure 1A:
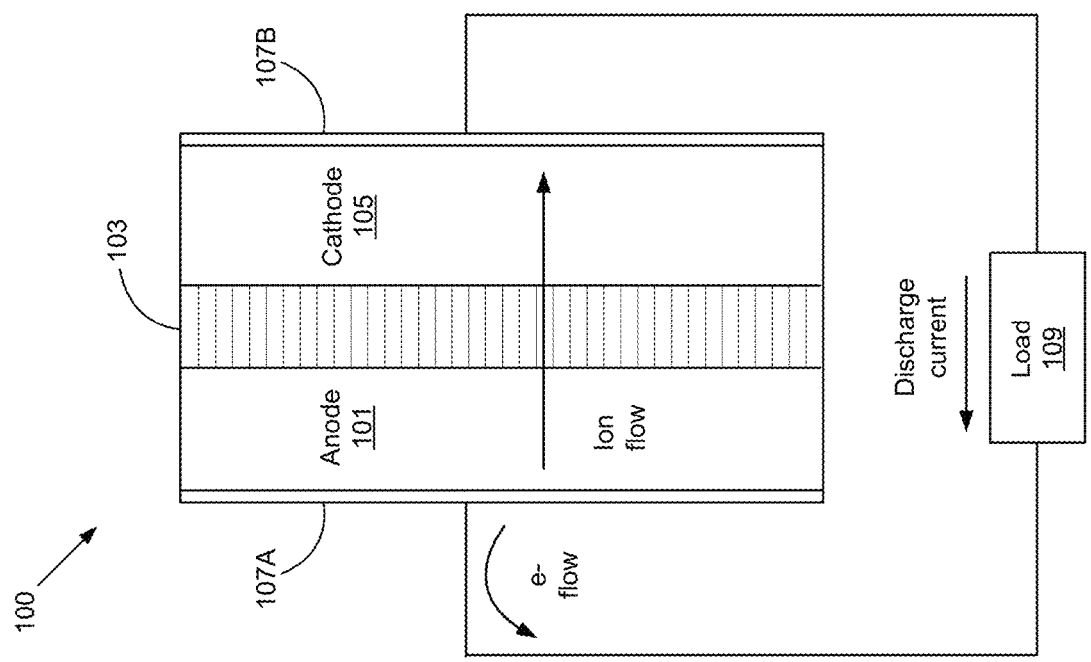

FIG. 1A is a diagram of an example battery. Referring to FIG. 1A, there is shown a battery 100 comprising a separator 103 sandwiched between an anode 101 and a cathode 105, with current collectors 107A and 107B. There is also shown a load 109 coupled to the battery 100 illustrating instances when the battery 100 is in discharge mode. In this disclosure, the term "battery" may be used to indicate a single electrochemical cell, a plurality of electrochemical cells formed into a module, and/or a plurality of modules formed into a pack. Furthermore, the battery 100 shown in FIG. 1A is a very simplified example merely to show the principle of operation of a lithium ion cell. Examples of realistic structures are shown to the right in FIG. 1A, where stacks of electrodes and separators are utilized, with electrode coatings typically on both sides of the current collectors. The stacks may be formed into different shapes, such as a coin cell, cylindrical cell, or prismatic cell, for example.

The development of portable electronic devices and electrification of transportation drive the need for high performance electrochemical energy storage. Small-scale (<100 Wh) to large-scale (>10 KWh) devices primarily use lithium-ion (Li-ion) batteries over other rechargeable battery chemistries due to their high-performance.

The anode 101 and cathode 105, along with the current collectors 107A and 107B, may comprise the electrodes, which may comprise plates or films within, or containing, an electrolyte material, where the plates may provide a physical barrier for containing the electrolyte as well as a conductive contact to external structures. In other embodiments, the anode/cathode plates are immersed in electrolyte while an outer casing provides electrolyte containment. The anode 101 and cathode 105 are electrically coupled to the current collectors 107A and 107B, which comprise metal or other conductive material for providing electrical contact to the electrodes as well as physical support for the active material in forming electrodes.

The configuration shown in FIG. 1A illustrates the battery 100 in discharge mode, whereas in a charging configuration, the load 109 may be replaced with a charger to reverse the process. In one class of batteries, the separator 103 is generally a film material, made of an electrically insulating polymer, for example, that prevents electrons from flowing from anode 101 to cathode 105, or vice versa, while being porous enough to allow ions to pass through the separator 103. Typically, the separator 103, cathode 105, and anode 101 materials are individually formed into sheets, films, or active material coated foils. In this regard, different methods or processes may be used in forming electrodes, particularly silicon-dominant anodes. For example, lamination or direct coating may be used in forming a silicon anode. Examples of such processes are illustrated in and described with respect to FIGS. 2 and 3. Sheets of the cathode, separator and anode are subsequently stacked or rolled with the separator 103 separating the cathode 105 and anode 101 to form the battery 100. In some embodiments, the separator 103 is a sheet and generally utilizes winding methods and stacking in its manufacture. In these methods, the anodes, cathodes, and current collectors (e.g., electrodes) may comprise films.

In an example scenario, the battery 100 may comprise a solid, liquid, or gel electrolyte. The separator 103 preferably does not dissolve in typical battery electrolytes such as compositions that may comprise: Ethylene Carbonate (EC), Fluoroethylene Carbonate (FEC), Propylene Carbonate (PC), Dimethyl Carbonate (DMC), Ethyl Methyl Carbonate (EMC), Diethyl Carbonate (DEC), etc. with dissolved $LiBF_4$, $LiAsF_6$, $LiPF_6$, and $LiClO_4$ etc. In an example scenario, the electrolyte may comprise Lithium hexafluorophosphate ($LiPF_6$) and lithium bis(trifluoromethanesulfonyl)imide (LiTFSI) that may be used together in a variety of electrolyte solvents. Lithium hexafluorophosphate ($LiPF_6$) may be present at a concentration of about 0.1 to 2.0 molar (M) and lithium bis(trifluoromethanesulfonyl)imide (LiTFSI) may be present at a concentration of about 0 to 2.0 molar (M). Solvents may comprise one or more of ethylene carbonate (EC), fluoroethylene carbonate (FEC) and/or ethyl methyl carbonate (EMC) in various percentages. In some embodiments, the electrolyte solvents may comprise one or more of EC from about 0-40%, FEC from about 2-40% and/or EMC from about 50-70% by weight.

The separator 103 may be wet or soaked with a liquid or gel electrolyte. In addition, in an example embodiment, the separator 103 does not melt below about 100 to 120° C., and exhibits sufficient mechanical properties for battery applications. A battery, in operation, can experience expansion and contraction of the anode and/or the cathode. In an example embodiment, the separator 103 can expand and contract by at least about 5 to 10% without failing, and may also be flexible.

The separator 103 may be sufficiently porous so that ions can pass through the separator once wet with, for example, a liquid or gel electrolyte. Alternatively (or additionally), the separator may absorb the electrolyte through a gelling or other process even without significant porosity. The porosity of the separator 103 is also generally not too porous to allow the anode 101 and cathode 105 to transfer electrons through the separator 103.

The anode 101 and cathode 105 comprise electrodes for the battery 100, providing electrical connections to the device for transfer of electrical charge in charge and discharge states. The anode 101 may comprise silicon, carbon, or combinations of these materials, for example. Typical anode electrodes comprise a carbon material that includes a current collector such as a copper sheet. Carbon is often used because it has excellent electrochemical properties and is also electrically conductive. Anode electrodes currently used in rechargeable lithium-ion cells typically have a specific capacity of approximately 200 milliamp hours per gram. Graphite, the active material used in most lithium ion battery anodes, has a theoretical energy density of 372 milliamp hours per gram (mAh/g). In comparison, silicon has a high theoretical capacity of 4200 mAh/g. In order to increase volumetric and gravimetric energy density of lithium-ion batteries, silicon may be used as the active material for the cathode or anode. Silicon anodes may be formed from silicon composites, with more than 50% silicon or more by weight in the anode material on the current collector, for example.

In an example scenario, the anode 101 and cathode 105 store the ion used for separation of charge, such as lithium. In this example, the electrolyte carries positively charged lithium ions from the anode 101 to the cathode 105 in discharge mode, as shown in FIG. 1A for example, and vice versa through the separator 103 in charge mode. The movement of the lithium ions creates free electrons in the anode 101 which creates a charge at the positive current collector 107B. The electrical current then flows from the current collector through the load 109 to the negative current collector 107A. The separator 103 blocks the flow of electrons inside the battery 100, allows the flow of lithium ions, and prevents direct contact between the electrodes.

While the battery 100 is discharging and providing an electric current, the anode 101 releases lithium ions to the cathode 105 via the separator 103, generating a flow of electrons from one side to the other via the coupled load 109. When the battery is being charged, the opposite happens where lithium ions are released by the cathode 105 and received by the anode 101.

The materials selected for the anode 101 and cathode 105 are important for the reliability and energy density possible for the battery 100. The energy, power, cost, and safety of current Li-ion batteries need to be improved in order to, for example, compete with internal combustion engine (ICE) technology and allow for the widespread adoption of electric vehicles (EVs). High energy density, high power density, and improved safety of lithium-ion batteries are achieved with the development of high-capacity and high-voltage cathodes, high-capacity anodes and functionally non-flammable electrolytes with high voltage stability and interfacial compatibility with electrodes. In addition, materials with low toxicity are beneficial as battery materials to reduce process cost and promote consumer safety.

The performance of electrochemical electrodes, while dependent on many factors, is largely dependent on the robustness of electrical contact between electrode particles, as well as between the current collector and the electrode particles. The electrical conductivity of silicon anode electrodes may be manipulated by incorporating conductive additives with different morphological properties. Carbon black (Super P), vapor grown carbon fibers (VGCF), and a mixture of the two have previously been incorporated separately into the anode electrode resulting in improved performance of the anode. The synergistic interactions between the two carbon materials may facilitate electrical contact throughout the large volume changes of the silicon anode during charge and discharge as well as provide additional mechanical robustness to the electrode and provide mechanical strength (e.g., to keep the electrode material in place). Graphenes and carbon nanotubes may be used because they may show similar benefits. Thus, in some instances, a mixture of two or more of carbon black, vapor grown carbon fibers, graphene, and carbon nanotubes may be used as such mixtures or combinations may be especially beneficial.

State-of-the-art lithium-ion batteries typically employ a graphite-dominant anode as an intercalation material for lithium. Silicon-dominant anodes, however, offer improvements compared to graphite-dominant Li-ion batteries. Silicon exhibits both higher gravimetric (3579 mAh/g vs. 372 mAh/g for graphite) and volumetric capacities (2194 mAh/L vs. 890 mAh/L for graphite). In addition, silicon-based anodes have a low lithiation/delithiation voltage plateau at about 0.3-0.4V vs. Li/Li+, which allows it to maintain an open circuit potential that avoids undesirable Li plating and dendrite formation. While silicon shows excellent electrochemical activity, achieving a stable cycle life for silicon-based anodes is challenging due to silicon's large volume changes during lithiation and delithiation. Silicon regions may lose electrical contact from the anode as large volume changes coupled with its low electrical conductivity separate the silicon from surrounding materials in the anode.

In addition, the large silicon volume changes exacerbate solid electrolyte interphase (SEI) formation, which can further lead to electrical isolation and, thus, capacity loss. Expansion and shrinkage of silicon particles upon charge-discharge cycling causes pulverization of silicon particles, which increases their specific surface area. As the silicon surface area changes and increases during cycling, SEI repeatedly breaks apart and reforms. The SEI thus continually builds up around the pulverizing silicon regions during cycling into a thick electronic and ionic insulating layer. This accumulating SEI increases the impedance of the electrode and reduces the electrode electrochemical reactivity, which is detrimental to cycle life.

In some implementations, dedicated systems and/or software may be used for controlling and managing of batteries or packs thereof. In this regard, the software may run on suitable circuitry, such as on processing circuitry (e.g., general processing units) already present in in the systems or it may be implemented on dedicated hardware. For example, battery packs (e.g., those used in electric vehicles) may be equipped with a battery management system (BMS) for managing the batteries (or packs) and operations. An example battery management system (BMS) is illustrated in and described in more detail with respect to FIG. 1B.

In accordance with the present disclosure, control and management of batteries, particularly lithium-ion batteries with silicon-dominant anodes—that is >50% of the active material is silicon (also referred to herein as "Si/Li batteries"), and operation thereof may be improved by use of algorithms for optimizing voltage related parameters, such as voltage and/or current windows. In this regard, battery control and management systems, such as the BMS illustrated in FIG. 1B, may be configured to use algorithms based on models for optimizing various features of the batteries and operation thereof—e.g., being intended to protect the battery or battery pack while maximizing its power output and charge speed. This may include, e.g., control of voltage in conjunction with operation of batteries. In this regard, voltage limits of batteries are typically manufacturer-determined properties and do not change. Battery control and management systems (e.g., BMS) are configured to ensure that the batteries stay within these limits, and while these systems may perform voltage compensation, in which the voltage supplied to the battery may be adjusted slightly (e.g., to account for changes in parasitic resistances), the voltage limits of a battery's electrodes themselves are not intended to change. Thus, in conventional solutions, battery control and management systems (e.g., BMS) may not balance the tradeoff between voltage limits and maximum capacity in any way.

Further, battery control and management systems (e.g., BMS) may also incorporate and utilize models in conjunction with control and/or management of the batteries and their operation, and in some instances such algorithms as described herein may be used in conjunction with these models. For example, battery control and management systems (e.g., BMS) may use such models to calculate or assess the state-of-health (SOH) and/or state-of-charge (SOC) of the battery. Based on these calculations, the battery control and management systems (e.g., BMS) may adjust the maximum current of the battery. For example, the charge current may be lowered when the battery is below 20% SOC and above 80% SOC, the maximum charge rate may be reduced when the SOH is below 50%, the maximum allowed current may be greatly reduced if one battery in a pack is deemed to be at critical SOH, etc. Such adjustments are applied to the current, however, and do not make changes to the voltage limits.

Solutions in accordance with the present disclosure overcome and resolve at least some of the limitations or shortcomings of conventional solutions, particularly by use of algorithms for optimizing voltage related parameters, such as voltage and/or current windows. Use of such algorithms provide various advantageous over any existing solutions, including, e.g., managing the tradeoff between energy density and cycle life that is specific to Li/Si batteries based on any set of constraints, extending the cycle life of a battery by widening the voltage and/or current windows when the battery is at low state-of-health, and optimizing battery performance based on voltage range. In this regard, because conventional solutions are based and focused on traditional Li-ion batteries—that is, with graphite-dominant anodes, the minimum voltage is not typically treated as an adjustable parameter. Specifically, in conventional solutions, which are focused on and tailored for conventional Li-ion batteries (e.g., with graphite-dominate anodes), the minimum-voltage-dependent tradeoff between energy density and cycle life does not exist, and as such any voltage control algorithms that may be used in conjunction with managing and controlling the battery do not include such tradeoff, and thus do not alter the minimum voltage.

In contrast, solutions based on the present disclosure are directed toward the physical phenomena that may be unique to Li/Si batteries, using models and algorithms to optimize the system within a set of constraints. Nonetheless, these solutions may also be expanded to other battery systems, given requisite physical knowledge of the system, and/or may also be applied to a parameter other than minimum voltage if the relationship between that parameter and cycle life and energy density are known and can be modeled. Accordingly, such algorithms may be utilized to greatly improve the lifetime usable energy from cells. Such algorithms and example embodiments based thereon, are described in more detail below.

Figure 1B:
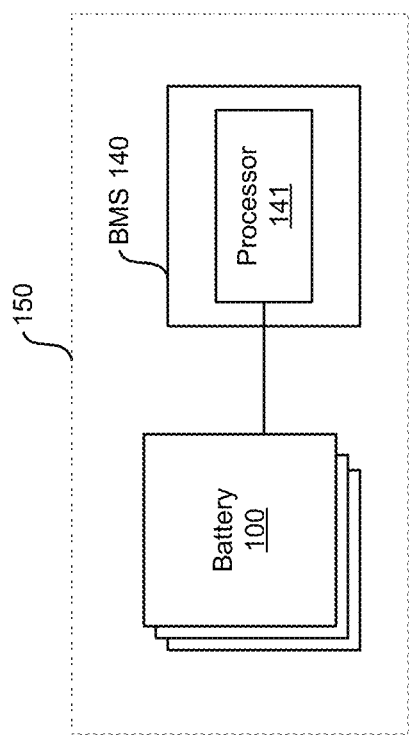
FIG. 1B is a block diagram of an example battery management system (BMS) for use in managing operation of batteries.

FIG. 1B illustrate an example battery management system (BMS) for use in managing operation of batteries. Shown in FIG. 1B is battery management system (BMS) 140.

The battery management system (BMS) 140 may comprise suitable circuitry (e.g., processor 141) configured to manage one or more batteries (e.g., each being an instance of the battery 100 as described with respect with FIG. 1A). In this regard, the BMS 140 may be in communication and/or coupled with each battery 100.

In some embodiments, the battery 100 and the BMS 140 may be in communication and/or coupled with each other, for example, via electronics or wireless communication. In some embodiments, the BMS 140 may be incorporated into the battery 100. Alternatively, in some embodiments, the BMS 140 and the battery 100 may be combined into a common package 150. Further, in some embodiments, the BMS 140 and the battery 100 may be separate devices/components, and may only be in communication with one another when present in the same system. The disclosure is not limited to any particular arrangement, however.

In accordance with the present disclosure, control and management of batteries, particularly lithium-ion batteries with silicon-dominant anodes (also referred to herein as "Si/Li batteries"), and operation thereof may be improved by use of algorithms for optimizing voltage related parameters, such as voltage and/or current windows. In this regard, traditional Li-ion batteries, which contain anodes consisting primarily (>50%) of graphite as an active material, have a certain rated voltage range whose upper limit is determined by the maximum operating voltage of the cathode and whose lower limit is very close to the true zero state of charge of the battery. Such voltage limits are manufacturer-determined properties of the battery and do not change. Battery control and management systems (e.g., the BMS 140) may be configured to ensure that the battery stays within these limits, and while it may perform voltage compensation, in which the voltage supplied to the battery is adjusted slightly to account for changes in parasitic resistances, the voltage limits of the battery electrodes themselves are not intended to change. There are typically minimal benefits to operating the battery within a different voltage range; although reducing the maximum voltage may slightly reduce the amount of electrolyte and cathode degradation, the resulting loss in energy density does not outweigh the minimal benefits.

In Li/Si batteries, in which >50% of the active material is silicon, there are more complex relationships between voltage and/or current windows, energy density, and cycle life. There is a nonlinear (or significantly less-linear) relationship between the minimum voltage and the life of the battery, where lower voltage limits result in worse lifetime. As a result, there is a tradeoff between energy density and cycle life that is controlled by the minimum voltage. Because the relationship is nonlinear, and depends on the specific cell balance and individual components (e.g., cathode, anode, separator, and electrolyte) of the battery, an accurate model is required to properly describe how the selection of minimum voltage will affect the battery's performance. This model may then be incorporated into the BMS algorithm, allowing the voltage limits of the battery to be changed over the course of the battery's life.

Solutions in accordance with the present disclosure overcome and resolve at least some of the limitations or shortcomings of conventional solutions, particularly by use of algorithms for optimizing voltage related parameters, such as voltage and/or current windows. In this regard, battery control and management systems, such as the BMS 140 of FIG. 1B, may be configured to implemented and use such algorithms for optimizing the performance of batteries managed thereby—e.g., battery 100. For example, such algorithms may be implemented in the processor 141. In this regard, the processor 141 may be configured to store and use such algorithms in conjunction with the management of the battery 100. Further, the processor 141 may also be configured to update such algorithms, such as based on use thereof in conjunction with the management of the battery 100.

In some embodiments, the BMS 140 may be configured to in implement and use an algorithm that controls the voltage range of a battery to maximize any combination of the following: cycle life, energy density, cumulative capacity before end of life, or cumulative energy before end of life. Combinations include but are not limited to mathematical combinations of these variables where different variables are assigned different weights or allowed ranges.

In some embodiments, the algorithm may be configured to use other data from the manufacturing of the battery cell as a variable such as electrode quality metrics such as loading, thickness, cell quality metrics such as capacity, energy density, impedance, and all information collected during the formation of the cell such as first charge capacity, first discharge capacity, etc.

In some embodiments, the algorithm may be configured to make changes to the operational envelope (e.g. voltage limits, current limits, temperature limits, pressure limits, etc.) based on the output of a physics-based model. The changes to the operational envelope may be made in real time based on the model's calculations on data from the battery collected during its operation.

In some embodiments, the algorithm may be configured to make changes to voltage and/or current limits based on the output of a machine-learning-based model. The changes to the voltage and/or current limits may be made in real time based on the model's calculations on data from the battery collected during its operation.

In some embodiments, the algorithm may be configured to make changes to voltage and/or current limits based on the output of a combination of a physics-based model and machine-learning-based model. The changes to the voltage and/or current limits may be made in real time based on the model's calculations on data from the battery collected during its operation.

In some embodiments, the combination of physics-based and ML-based models may be tuned using a Kalman filter or similar digital filter.

In some embodiments, the algorithm may be configured to use a predetermined voltage and/or current limit profile, which may be applied to the battery based on the optimization of a model. Additional changes to the voltage and/or current limits may also be made in real time based on the model's calculations on data from the battery collected during its operation.

In some embodiments, the algorithm may be configured specifically for Li/Si batteries, and unique characteristics and/or parameters associated therewith.

In some embodiments, the changes to the voltage and/or current limits may be limited, such as to be lower than a certain threshold to ensure that the changes are less or not perceptible to the user (e.g., less than 5%, less than 2%, less than 1%, less than 0.5% every 5 cycles, 10 cycles, 20 cycles, 25 cycles, 50 cycles, or 100 cycles or cycle equivalents)

In some embodiments, the changes to the voltage and/or current limits are limited to be lower than a certain threshold to ensure that the changes are less or not perceptible to the user (e.g., less than 5%, less than 2%, less than 1%, less than 0.5% every 0.5%, 1%, 2%, 3%, 4%, 5%, 10% degradation vs the initial capacity).

In some embodiments, the algorithm may be configured to utilize maximum or minimum limits to where the voltage may be adjusted—e.g., 4.1V, 4.15V, 4.2V, 4.25V, 4.3V, or 4.35V as the maximum voltage, 2V, 2.5V, 2.7V, 2.75V, 2.8V, 3V or 3.1V as the minimum voltage In some embodiments, the adjustments start or stop at a certain state-of-health (SOH). For example, the algorithm may be started after 2%, 5% or 10% reduction on SOH, may be stopped after 2%, 5%, 10%, 15%, or 20% SOH, or a combination of starting and stopping at certain points in the cell's life.

In some embodiments, the BMS may incorporate algorithms with any of the variations or featured disclosed herein.

In some embodiments, a car or other electric mobility platform containing any iteration of the above algorithms for cell life extension In some embodiments, algorithms with any of the variations or featured disclosed herein may implemented in an Energy Storage System (ESS).

In some embodiments, algorithms in accordance with the present disclosure may be used in conjunction with other performance enhancement measures or solutions. For example, these algorithms may be used in conjunction with enhanced SOH models, which may also be implemented by the BMS 140. In this regard, SOH models may be used by the BMS 140 for assessing SOH of a battery (or pack of batteries) based on one or more specific considerations or metrics. Enhanced SOH models may be configured for enhanced operations, such as by use of data conventionally not used and/or by being particularly configured for Li/Si batteries. Enhanced SOH models are described in more detail in incorporated U.S. patent application Ser. No. 17/548,845.

Figure 2:
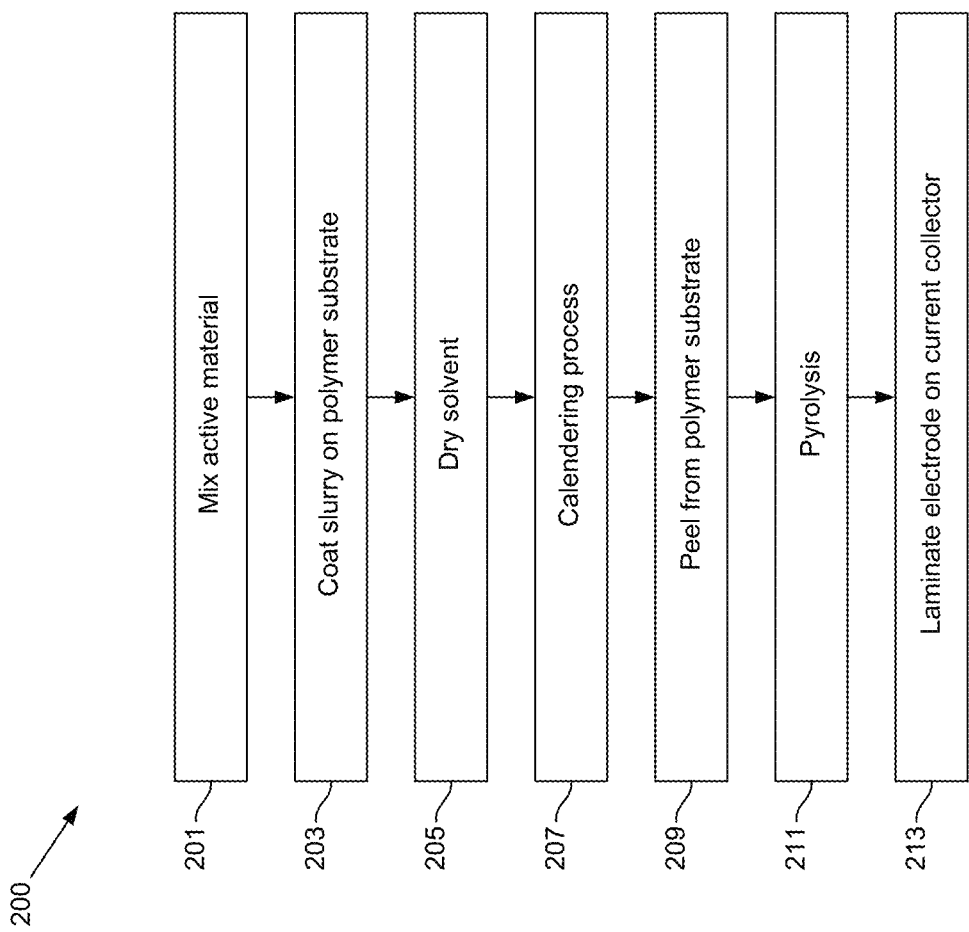
FIG. 2 is a flow diagram of an example lamination process for forming a silicon anode.

FIG. 2 is a flow diagram of an example lamination process for forming a silicon anode. Shown in FIG. 2 is flow chart 200, comprising a plurality of example steps (represented as blocks 201-213) for an example lamination process. In this regard, this process employs a high-temperature pyrolysis process on a substrate, layer removal, and a lamination process to adhere the active material layer to a current collector.

The raw electrode active material is mixed in step 201. In the mixing process, the active material may be mixed, e.g., a binder/resin (such as PI, PAI), solvent (e.g., as organic or aqueous), and conductive additives. The materials may comprise carbon nanotubes/fibers, graphene sheets, graphene oxide, metal polymers, metals, semiconductors, and/or metal oxides, for example. The additives may comprise 1D filaments with one dimension at least 4×, at least 10×, or at least 20× that of the other two dimensions, 2D sheets or mesh with two dimensions at least 4×, at least 10×, or at least 20× that of the other dimension, or 3D structures with one dimension at least 20×, at least 10×, or at least 4× that of the other two, where none of the dimensions are of nanoscale size. Silicon powder with a 1-30 or 5-30 µm particle size, for example, may then be dispersed in polyamic acid resin (15% solids in N-Methyl pyrrolidone (NMP)) at, e.g., 1000 rpm for, e.g., 10 minutes, and then the conjugated carbon/NMP slurry may be added and dispersed at, e.g., 2000 rpm for, e.g., 10 minutes to achieve a slurry viscosity within 2000-4000 cP and a total solid content of about 30%.

In step 203, the slurry may be coated on a substrate. In this step, the slurry may be coated onto a Polyester, polyethylene terephthalate (PET), or Mylar film at a loading of, e.g., 2-4 mg/cm$^2$ and then in step 205 undergo drying to an anode coupon with high Si content and less than 15% residual solvent content. This may be followed by an optional calendering process in step 207, where a series of hard pressure rollers may be used to finish the film/substrate into a smoothed and denser sheet of material.

In step 209, the green film may then be removed from the PET, where the active material may be peeled off the polymer substrate, the peeling process being optional for a polypropylene (PP) substrate, since PP can leave ~2% char residue upon pyrolysis. The peeling may be followed by a pyrolysis step 211 where the material may be heated to >900° C. but less than 1250° C. for 1-3 hours, cut into sheets, and vacuum dried using a two-stage process (120° C. for 15 h, 220° C. for 5 h). The dry film may be thermally treated at, e.g., 1100-1200° C. to convert the polymer matrix into carbon.

In step 212 the electrode material may be laminated on a current collector. For example, a 5-20 µm thick copper foil may be coated with polyamide-imide with a nominal loading of, e.g., 0.2-0.6 mg/cm$^2$ (applied as a 6 wt % varnish in NMP and dried for, e.g., 12-18 hours at, e.g., 110° C. under vacuum). The anode coupon may then be laminated on this adhesive-coated current collector. In an example scenario, the silicon-carbon composite film is laminated to the coated copper using a heated hydraulic press. An example lamination press process comprises 30-70 seconds at 300° C. and 3000-5000 psi, thereby forming the finished silicon-composite electrode.

The process described above is one example process that represents a composite with fabrication steps including pyrolysis and lamination. Another example scenario comprises a direct coating process in which an anode slurry is directly coated on a copper foil using a binder such as CMC, SBR, Sodium Alginate, PAI, PI, PAA, and mixtures and combinations thereof. The process in this example comprises: direct coat active material on a current collector, dry, calendering, heat treatment.

In a direct coating process, an anode slurry is coated on a current collector with residual solvent followed by a calendaring process for densification followed by pyrolysis (~500-800° C.) such that carbon precursors are partially or completely converted into pyrolytic carbon. Pyrolysis can be done either in roll form or after punching. If done in roll form, the punching is done after the pyrolysis process.

In another example of a direct coating process, an anode slurry may be coated on a current collector with low residual solvent followed by a calendaring process for densification followed by removal of residual solvent.

Figure 3:
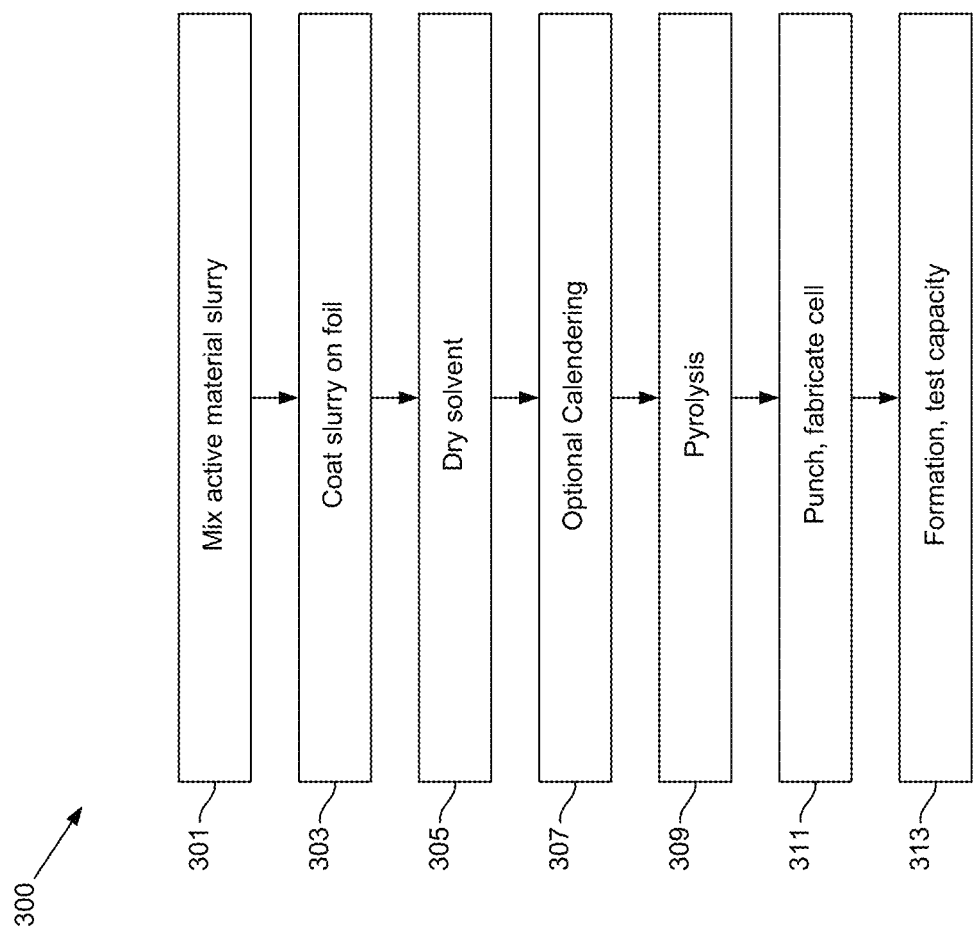
FIG. 3 is a flow diagram of an example direct coating process for forming a silicon anode.

In an example scenario, the conductive structural additives, which may be added in step 201 in FIG. 2 or step 301 in FIG. 3, may comprise between 1 and 40% by weight of the anode composition, with between 50% and 99% silicon by weight. The fibrous (1D) particles may have an aspect ratio of at least 4, but may be higher than 10, higher than 20, or higher than 40, for example, and may comprise a tubular or fiber-like conductive structure with nanoscale size in two-dimensions, where carbon-based examples comprise carbon nanotubes, carbon nanofibers (CNF), and vapor grown carbon fibers (VGCP). Other fibrous structures are possible, such as metals, metal polymers, metal oxides The 2D carbon structures may have an average dimension in the micron scale in each of the two non-nanoscale dimensions that is at least 4× that in the thickness direction, for example, and may be at least 20× larger, or at least 40× larger in the lateral directions as compared to the thickness direction. Graphene sheets are an example of conductive carbon additives, while other 2D structures are possible, such as "wire" meshes of metal or metal polymers, for example.

Furthermore, the active material may comprise 3D conductive structural additives, where the material is not limited to nanoscale in any one dimension. In a 3D additive example, one dimension of the structure may be at least 4×, at least 10×, or at least 20× that of the other two dimensions, where none of the dimensions are of nanoscale size. Examples of 3D conductive structural additives may be "chunks" of carbon, metal, metal polymer, or semiconductors.

In another example scenario, the anode active material layer fabricated with the carbon additive described above may comprise 20 to 95% silicon and in yet another example scenario may comprise 50 to 95% silicon by weight.

FIG. 3 is a flow diagram of an example direct coating process for forming a silicon anode. Shown in FIG. 3 is flow chart 300, comprising a plurality of example steps (represented as blocks 301-313) for an example direct coating process. In this regard, this process comprises physically mixing the active material, conductive additive, and binder together, and coating it directly on a current collector. This example process comprises a direct coating process in which an anode or cathode slurry is directly coated on a copper foil using a binder such as CMC, SBR, Sodium Alginate, PAI, PI, PAA, and mixtures and combinations thereof.

In step 301, the active material may be mixed, e.g., a binder/resin (such as PI, PAI), solvent, and conductive and structural additive. For example, the additives may comprise conductive materials that also provide structural continuity between cracks in the anode following multiple cycles. The materials may comprise carbon nanotubes/fibers, graphene sheets, metal polymers, metals, semiconductors, and/or metal oxides, metal/carbon nanofiber or metal/carbon nanotube composites, carbon nanowire bundles, for example. Silicon powder with a 5-30 µm particle size, for example, may then be dispersed in polyamic acid resin (15% solids in N-Methyl pyrrolidone (NMP)) at, e.g., 1000 rpm for, e.g., 10 minutes, and then the conjugated carbon/NMP slurry may be added and dispersed at, e.g., 2000 rpm for, e.g., 10 minutes to achieve a slurry viscosity within 2000-4000 cP and a total solid content of about 30%.

Furthermore, cathode active materials may be mixed in step 301, where the active material may comprise lithium cobalt oxide (LCO), lithium manganese oxide (LMO), lithium iron phosphate (LFP), lithium nickel cobalt manganese oxide (NMC), lithium nickel cobalt aluminum oxide (NCA), nickel, cobalt, manganese and aluminum (NCMA), lithium nickel manganese spinel, or similar materials or combinations thereof, mixed with a binder as described above for the anode active material.

In step 303, the slurry may be coated on a copper foil. Similarly, cathode active materials may be coated on a foil material, such as aluminum, for example. The active material layer may undergo a drying in step 305 resulting in reduced residual solvent content. An optional calendering process may be utilized in step 307 where a series of hard pressure rollers may be used to finish the film/substrate into a smoother and denser sheet of material. In step 307, the foil and coating proceeds through a roll press for lamination.

In step 309, the active material may be pyrolyzed by heating to 500-1000° C. such that carbon precursors are partially or completely converted into glassy carbon. The pyrolysis step may result in an anode active material having silicon content greater than or equal to 50% by weight, where the anode has been subjected to heating at or above 400° C.

Pyrolysis can be done either in roll form or after punching in step 311. If done in roll form, the punching is done after the pyrolysis process. In instances where the current collector foil is not pre-punched/pre-perforated, the formed electrode may be perforated with a punching roller, for example. The punched electrodes may then be sandwiched with a separator and electrolyte to form a cell. In some instances, separator with significant adhesive properties, in accordance with the present disclosure, maybe utilized.

In step 313, the cell may be subjected to a formation process, comprising initial charge and discharge steps to lithiate the anode, with some residual lithium remaining, and the cell capacity may be assessed.

Figure 4:
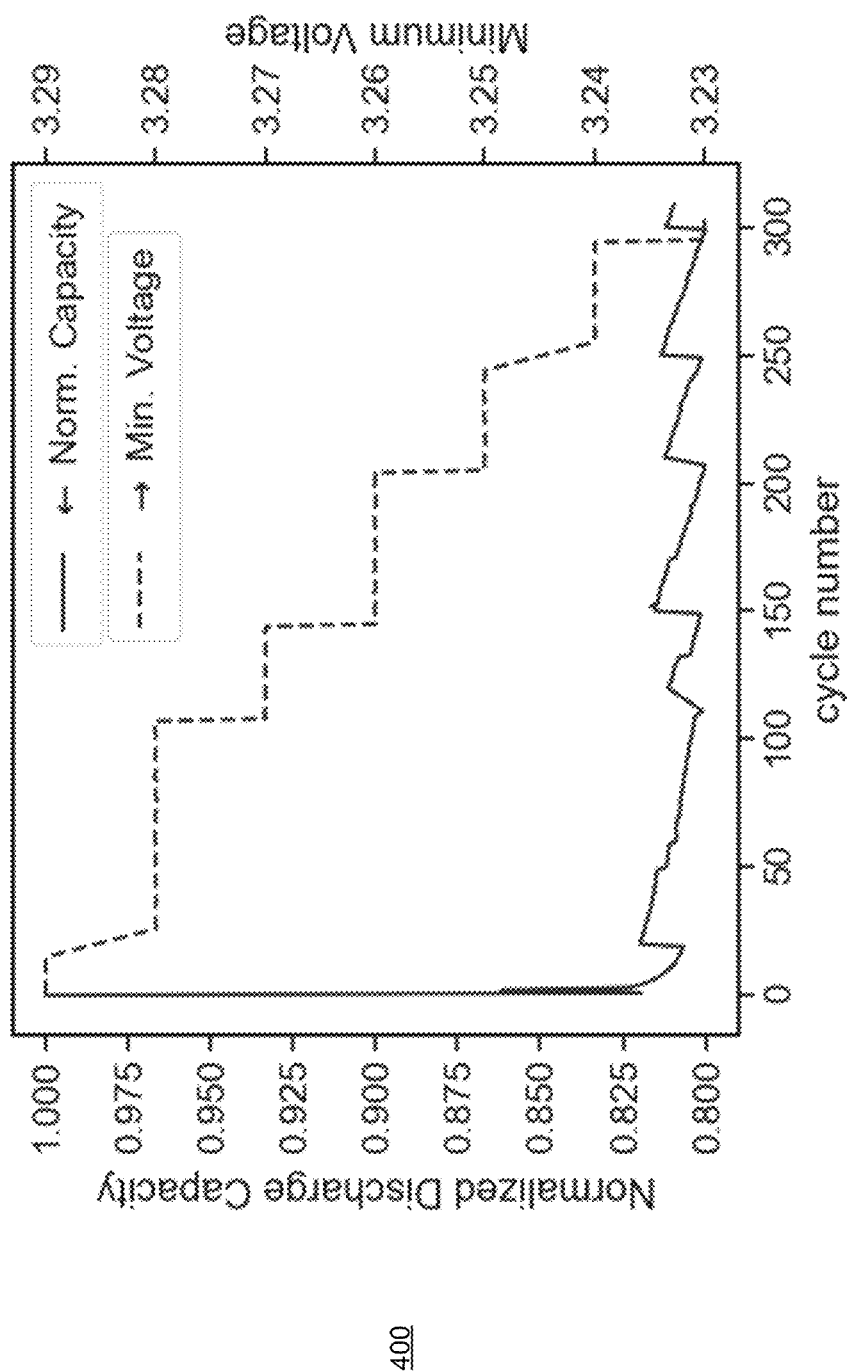
FIG. 4 is a plot diagram illustrating normalized capacity and minimum voltage as a function of cycle number for an example battery controlled by an algorithm in accordance with the present disclosure.

FIG. 4 is a plot diagram illustrating normalized capacity and minimum voltage as a function of cycle number for an example battery controlled by an algorithm in accordance with the present disclosure. Shown in FIG. 4 is graph 400.

Illustrated in graph 400 is each of normalized discharge capacity and minimum voltage as a function of cycle number for a battery controlled using an algorithm in accordance with the present disclosure. The battery may be a Si/Li battery as described herein. As shown FIG. 4, in graph 400 the left y-axis is normalized discharge capacity values, the right y-axis is minimum voltage, and the x-axis is a number of cycles. The algorithm controls the minimum voltage, by setting the minimum voltage to the highest possible value that keeps the capacity over a particular value relative to the initial capacity, such as 0.8—that is, the minimum voltage is the voltage that needs be used to maintain the capacity of the battery over 80% initial capacity. In this regard, 80% initial capacity corresponds to end of life capacity.

Thus, as illustrated in FIG. 4, graph 400 shows an example of the capacity and minimum voltage profiles of a Li/Si battery that has been controlled with the algorithm that is set to maintain a normalized capacity value (e.g., above 0.8), while maximizing the minimum voltage (and thus the cycle life). Every ten cycles, the algorithm uses a model to calculate the highest minimum voltage value that will allow the normalized discharge capacity to be above 0.8. It then sets the minimum voltage to this calculated value. The total number of cycles above 0.8 normalized capacity is thus optimized.

The particular constraints captured in graph 400—that is, normalized capacity above 0.8 normalized capacity and the choice to maximize cycle life are not limiting and are merely by way of an example of how algorithms in accordance with the present disclosure may be applied. Accordingly, other combinations of constraints and values may be selected and used, as long as the algorithm and models based thereon may be able to calculate the necessary information, and as long as it is possible for the battery to be operated in a manner that satisfies the constraints.

Figure 5:
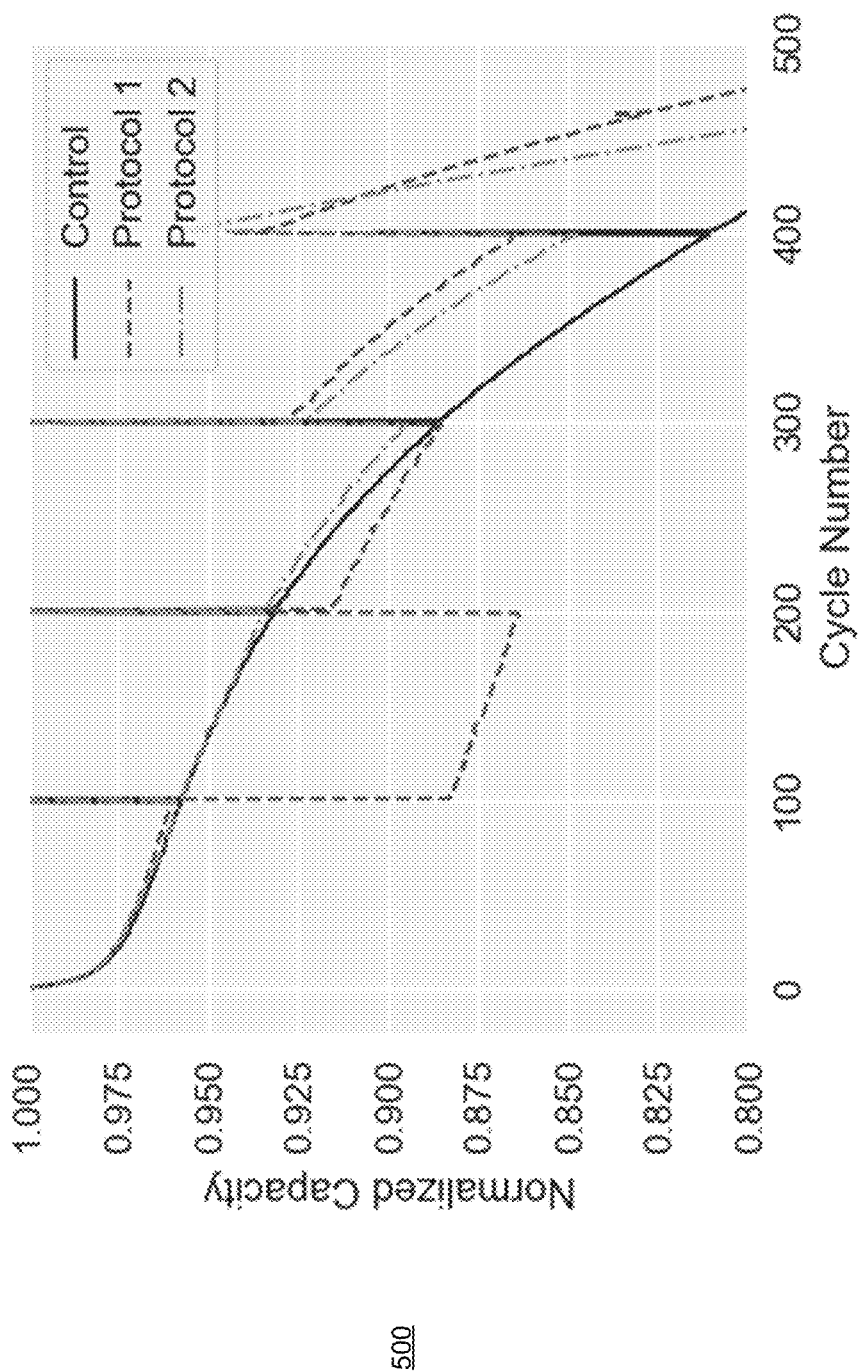
FIG. 5 is a plot diagram illustrating normalized capacity as a function of cycle number for protocols optimizing the product of cycle life and cumulative capacity based on an algorithm in accordance with the present disclosure.

FIG. 5 is a plot diagram illustrating normalized capacity as a function of cycle number for protocols optimizing the product of cycle life and cumulative capacity based on an algorithm in accordance with the present disclosure. Shown in FIG. 5 is graph 500.

Illustrated in graph 500 is normalized discharge capacity as a function of cycle number for a set of batteries, particularly Si/Li batteries as described herein. In other words, in graph 500, the y-axis is the normalized discharge capacity values whereas the x-axis is number of cycles. In the example use scenario(s) represented in graph 500, an algorithm is used to modify the operating voltage at discrete cycling intervals. In particular, the algorithm controls the minimum voltage to be the highest possible value that keeps the capacity over particular value relative to the initial capacity (e.g., 80% initial capacity). In other words, 80% initial capacity corresponds to end of life capacity. As noted above, such algorithm may be used in conjunction with enhanced state-of-health (SOH) models, as described above. The use of the algorithm results in improvement in cycle life of the batteries.

As illustrated in FIG. 5, graph 500 shows data corresponding to two protocols where an algorithm has been used to modify the operating voltage of a set of batteries, compared to a control group where no modification is made. In particular, in the protocol labeled "protocol 1", the algorithm may be allowed to set the minimum voltage to a value higher than the initial minimum voltage, whereas in the protocol labeled "protocol 2", the algorithm is constrained to keep the minimum voltage equal to or lower than the initial minimum voltage. In both cases, the algorithm-based protocols have higher cycle life and cumulative discharge capacity than the control group.

As illustrated in graph 500, in the example use cases captured in graph 500, the batteries may achieve an average improvement in cycle life of 17% (cycles to 80% initial capacity). The table below shows average cycled capacity, average cycled energy, and average cycles to 80% results for control group (standard control) as well as protocol 1 and protocol 2. The results illustrate how non-obvious and unanticipated performance changes may be—e.g., where adjusting the voltage ranges results in increased average cycled energy and capacity:

TABLE 1

| comparisons between the protocols and the control group | | | |
|---|---|---|---|
| Protocol | Avg. Cycled Capacity (Ah) | Avg. Cycled Energy (Wh) | Avg. cycles to 80% |
| Daily Build (Control) | 100% | 100% | 100% |
| Protocol 1 | 115% | 115% | 117% |
| Protocol 2 | 119% | 111% | 111% |

Figure 6:
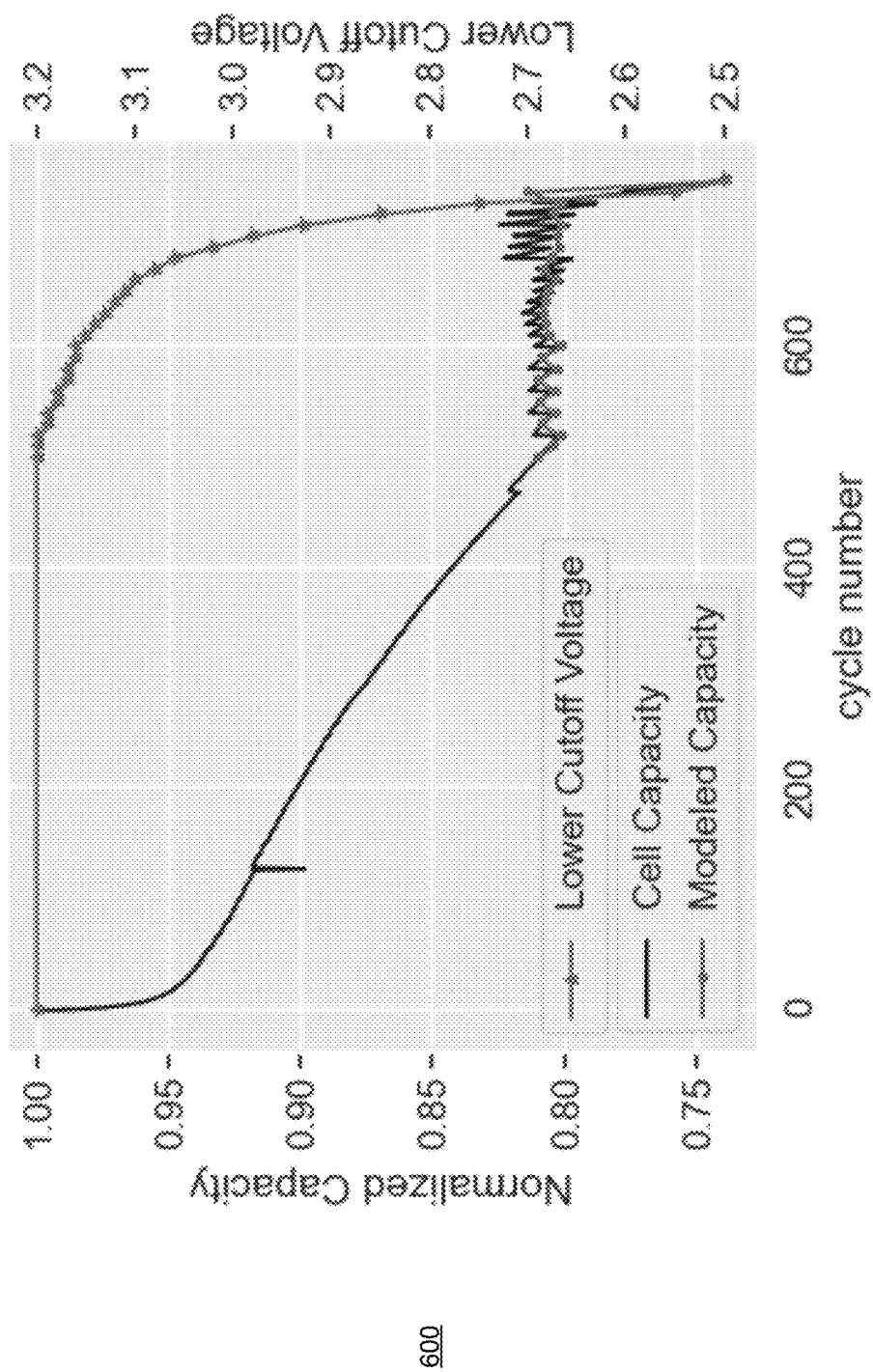
FIG. 6 is a plot diagram illustrating normalized capacity, modeled capacity, and minimum voltage as a function of cycle number for an example battery controlled by an algorithm in accordance with the present disclosure.

FIG. 6 is a plot diagram illustrating normalized capacity, modeled capacity, and minimum voltage as a function of cycle number for an example battery controlled by an algorithm in accordance with the present disclosure. Shown in FIG. 6 is graph 600.

As shown in FIG. 6, graph 600 captures data corresponding to the cycling of a battery controlled using an algorithm in accordance with the present disclosure. The solid trace with no markers, labeled "Cell Capacity" and corresponding to the left y-axis, is the measured normalized capacity of the cell. The solid trace with circular markers, labeled "Modeled Capacity" and corresponding to the left y-axis, is the capacity determined by a model on which the algorithm is based.

The solid trace with star markers, labeled "Lower Cutoff Voltage" and corresponding to the right y-axis, is the minimum voltage of the cell at each 10 cycle increment. The minimum voltage value is constant throughout each 10 cycle increment; the line in the plot is a guide for the eye. At cycle 530, the algorithm makes the first changes to the operating voltage of the cell. This point represents the cycles to 80% initial capacity of the cell under normal operating conditions. Thus, the use of the algorithm allows substantial improvement in the cycle life of the cell. As illustrated in graph 600, in the example use cases captured in graph 600, the cell may achieve an improvement in cycle life of 32% (cycles to 80% initial capacity).

Thus, as illustrated in FIG. 4, graph 400 shows an example of the capacity and minimum voltage profiles of a Li/Si battery that has been controlled with the algorithm that is set to maintain a normalized capacity value (e.g., above 0.8), while maximizing the minimum voltage (and thus the cycle life) without increasing the minimum voltage above its initial set value. Every ten cycles, the algorithm uses a model to calculate the highest minimum voltage value that will allow the normalized discharge capacity to be above 0.8 with the constraint that the minimum voltage cannot be above 3.2 V. It then sets the minimum voltage to this calculated value. The total number of cycles above 0.8 normalized capacity is thus optimized.

The particular constraints captured in graph 400—that is, normalized capacity above 0.8 normalized capacity, minimum voltage not to exceed 3.2 V, and the choice to maximize cycle life are not limiting and are merely by way of an example of how algorithms in accordance with the present disclosure may be applied. Accordingly, other combinations of constraints and values may be selected and used, as long as the algorithm and models based thereon may be able to calculate the necessary information, and as long as it is possible for the battery to be operated in a manner that satisfies the constraints.

An example method for managing a lithium-ion cell, in accordance with the present disclosure, comprises controlling voltage of the lithium-ion cell using an enhanced algorithm, wherein controlling the voltage comprises adjusting voltage limits applied during one or both of charging and discharging of the lithium-ion cell. The enhanced algorithm is configured to control a voltage range of the lithium-ion cell to maximize one or more variables associated with the lithium-ion cell comprising at least one of cycle life, energy density, cumulative capacity before end of life, and cumulative energy before end of life.

In an example implementation, the lithium-ion cell comprises a silicon-dominant cell comprising a silicon-dominant anode with silicon >50% of active material of the anode, and the enhanced algorithm is configured based on one or more characteristics unique to silicon-dominant cells.

In an example implementation, the combination comprises a mathematical combination of values corresponding to one or more variables where different variables are assigned different weights or allowed ranges.

In an example implementation, the enhanced algorithm is configured to control voltage range of the lithium-ion cell based on input data associated with the lithium-ion cell, the input data comprising manufacturing related data obtained or generated during manufacturing of the lithium-ion cell.

In an example implementation, the manufacturing related data comprises data relating to one or more of loading, thickness, cell quality metrics, and formation related information collected during formation of the lithium-ion cell, wherein the cell quality metrics comprises at one or more of capacity, energy density, and impedance, and wherein the formation related information comprises information relating to one or both of first charge capacity and first discharge capacity.

In an example implementation, the enhanced algorithm is configured for determining adjustments to one or both of the voltage limits and the current limits based on a model associated with the lithium-ion cell.

In an example implementation, the model comprises a machine learning (ML) based model.

In an example implementation, the model comprises a physics based model.

In an example implementation, the method further comprises using multiple models in conjunction with determining adjustments to one or both of the voltage limits and the current limits.

In an example implementation, the method further comprises tuning relative contribution of the multiple models using a Kalman filter or similar digital filter.

In an example implementation, the enhanced algorithm is configured for determining adjustments to voltage limits based on a predetermined voltage limit profile associated with the lithium-ion cell.

In an example implementation, the enhanced algorithm is configured for determining changes to the predetermined voltage limit profile in real time and based on calculations on data collected during operation of the lithium-ion cell.

In an example implementation, the enhanced algorithm is configured for determining adjustments to voltage limits to maintain capacity of the lithium-ion cell at particular value relative to an initial capacity of the lithium-ion cell.

An example system, in accordance with the present disclosure, comprises a lithium-ion cell, and one or more circuits for managing operation of the lithium-ion cell, where the one or more circuits are configured to control voltage of the lithium-ion cell using an enhanced algorithm, and where controlling the voltage comprises adjusting one or both of voltage limits and limits applied during one or both of charging and discharging of the lithium-ion cell. The enhanced algorithm is configured to control one or both of a voltage range and a current range of the lithium-ion cell to maximize one or more variables associated with the lithium-ion cell comprising one or more of cycle life, energy density, cumulative capacity before end of life, and cumulative energy before end of life.

In an example implementation, the lithium-ion cell comprises a silicon-dominant cell comprising a silicon-dominant anode with silicon >50% of active material of the anode, and the enhanced algorithm is configured based on one or more characteristics unique to silicon-dominant cells.

In an example implementation, the combination comprises a mathematical combination of values corresponding to one or more variables where different variables are assigned different weights or allowed ranges.

In an example implementation, the one or more circuits are configured, when the enhanced algorithm is applied, to control a voltage range of the lithium-ion cell based on input data associated with the lithium-ion cell, with the input data comprising manufacturing related data obtained or generated during manufacturing of the lithium-ion cell. The manufacturing related data may comprise data relating to one or more of loading, thickness, cell quality metrics, and formation related information collected during formation of the lithium-ion cell, wherein the cell quality metrics comprises at one or more of capacity, energy density, and impedance, and wherein the formation related information comprises information relating to one or both of first charge capacity and first discharge capacity.

In an example implementation, the one or more circuits are configured, when the enhanced algorithm is applied, to determine adjustments to voltage limits based on a model associated with the lithium-ion cell. The model may comprises a machine learning (ML) based model, or a physics based model.

In an example implementation, the one or more circuits are configured, when determining adjustments to one or both of voltage limits and current limits, to use multiple models.

In an example implementation, the one or more circuits are configured, when using multiple models, to tune relative contribution of an output of each model using a Kalman filter or a similar digital filter.

In an example implementation, the one or more circuits are configured, when the enhanced algorithm is applied, to determine adjustments to voltage limits based on a predetermined voltage limit profile associated with the lithium-ion cell.

In an example implementation, the one or more circuits are configured, when the enhanced algorithm is applied, to determine changes to the predetermined voltage limit profile in real time and based on calculations on data collected during operation of the lithium-ion cell.

In an example implementation, the one or more circuits are configured, when the enhanced algorithm is applied, to determine adjustments to voltage limits to maintain capacity of the lithium-ion cell at particular value relative to an initial capacity of the lithium-ion cell.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g.," set off lists of one or more non-limiting examples, instances, or illustrations.

As utilized herein the terms "circuits" and "circuitry" refer to physical electronic components (e.g., hardware), and any software and/or firmware ("code") that may configure the hardware, be executed by the hardware, and or otherwise be associated with the hardware. As used herein, for example, a particular processor and memory (e.g., a volatile or non-volatile memory device, a general computer-readable medium, etc.) may comprise a first "circuit" when executing a first one or more lines of code and may comprise a second "circuit" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc. Similarly, the term "module" may, for example, refer to a physical electronic components (e.g., hardware) and any software and/or firmware ("code") that may configure the hardware, be executed by the hardware, and or otherwise be associated with the hardware.

As utilized herein, circuitry or module is "operable" to perform a function whenever the circuitry or module comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for managing a lithium-ion cell, the method comprising:
   adjusting one or more limits applied during one or both of charging and discharging of the lithium-ion cell, using an enhanced algorithm;
   wherein the enhanced algorithm is configured to control the one or more limits of the lithium-ion cell to extend one or more of cycle life, cumulative capacity before end of life, and cumulative energy before end of life;
   wherein the enhanced algorithm uses a state-of-health model associated with the lithium-ion cell to calculate the one or more limits;
   wherein the one or more limits comprise one or more voltage limits that comprise a minimum voltage; and
   wherein the adjusting comprises altering the minimum voltage using the enhanced algorithm, based on a state-of-health modeling of a tradeoff between at least two parameters or characteristics of the lithium-ion cell.

2. The method of claim 1, wherein the lithium-ion cell comprises a silicon-dominant cell comprising a silicon-dominant anode with silicon >50% of active material of the anode, and wherein the enhanced algorithm is configured based on one or more characteristics unique to silicon-dominant cells.

3. The method of claim 1, wherein the enhanced algorithm is configured to determine a mathematical combination of values corresponding to one or more parameters associated with the lithium-ion cell, wherein the one or more parameters comprise or correspond to one or more of the cycle life, the cumulative capacity before end of life, the cumulative energy before end of life, and energy density, and wherein different weights or allowed ranges are assigned to the one or more parameters.

4. The method of claim 1, wherein the enhanced algorithm is configured to control one or both of a voltage range and a current range of the lithium-ion cell based on input data associated with the lithium-ion cell, the input data comprising manufacturing related data obtained or generated during manufacturing of the lithium-ion cell.

5. The method of claim 4, wherein the manufacturing related data comprises data relating to one or more of loading, thickness, cell quality metrics, and formation related information collected during formation of the lithium-ion cell, wherein the cell quality metrics comprises at one or more of capacity, energy density, and impedance, and wherein the formation related information comprises information relating to one or both of first charge capacity and first discharge capacity.

6. The method of claim 1, wherein the enhanced algorithm is configured for determining adjustments to the one or more limits based on a model associated with the lithium-ion cell.

7. The method of claim 6, wherein the model comprises a machine learning (ML) based model.

8. The method of claim 6, wherein the model comprises a physics based model.

9. The method of claim 1, further comprising using multiple models in conjunction with determining adjustments to the one or more limits.

10. The method of claim 9, further comprising tuning relative contribution of the multiple models using a Kalman filter or similar digital filter.

11. The method of claim 1, wherein the enhanced algorithm is configured for determining adjustments to the one or more limits based on a predetermined voltage limit profile associated with the lithium-ion cell.

12. The method of claim 1, wherein the enhanced algorithm is configured for determining changes to the predetermined voltage limit profile in real time and based on calculations on data collected during operation of the lithium-ion cell.

13. The method of claim 1, wherein the enhanced algorithm is configured for determining adjustments to the one or more limits to maintain capacity of the lithium-ion cell at particular value relative to an initial capacity of the lithium-ion cell.

14. A system comprising:
   a lithium-ion cell; and
   one or more circuits for managing operation of the lithium-ion cell, wherein the one or more circuits are configured to adjust one or more limits applied during one or both of charging and discharging of the lithium-ion cell, using an enhanced algorithm;
   wherein the enhanced algorithm is configured to control the one or more limits of the lithium-ion cell to extend one or more of cycle life, cumulative capacity before end of life, and cumulative energy before end of life;
   wherein the enhanced algorithm uses a state-of-health model associated with the lithium-ion cell to calculate the one or more limits;
   wherein the one or more limits comprise one or more voltage limits that comprise a minimum voltage; and
   wherein the adjusting comprises altering the minimum voltage using the enhanced algorithm, based on a state-of-health modeling of a tradeoff between at least two parameters or characteristics of the lithium-ion cell.

15. The system of claim 14, wherein the lithium-ion cell comprises a silicon-dominant cell comprising a silicon-dominant anode with silicon >50% of active material of the anode, and wherein the enhanced algorithm is configured based on one or more characteristics unique to silicon-dominant cells.

16. The system of claim 14, wherein the enhanced algorithm is configured to determine a mathematical combination of values corresponding to one or more parameters associated with the lithium-ion cell, wherein the one or more parameters comprise or correspond to one or more of the cycle life, the cumulative capacity before end of life, the cumulative energy before end of life, and energy density, and wherein different weights or allowed ranges are assigned to the one or more parameters.

17. The system of claim 14, wherein the one or more circuits are configured, when applying the enhanced algorithm, to control voltage range of the lithium-ion cell based on input data associated with the lithium-ion cell, the input data comprising manufacturing related data obtained or generated during manufacturing of the lithium-ion cell.

18. The system of claim 14, wherein the one or more circuits are configured, when the enhanced algorithm is applied, to determine adjustments to the one or more limits based on a model associated with the lithium-ion cell.

19. The system of claim 14, wherein the one or more circuits are configured, when determining adjustments to the one or more limits, to use multiple models.

20. The system of claim 14, wherein the one or more circuits are configured, when the enhanced algorithm is applied, to determine adjustments to voltage and/or limits based on a predetermined voltage and/or current limit profile associated with the lithium-ion cell.

21. The system of claim 19, wherein the one or more circuits are configured, when using multiple models, to tune relative contribution of an output of each model using a Kalman filter or a similar digital filter.

22. The system of claim 20, wherein the one or more circuits are configured, when the enhanced algorithm is applied, to determine changes to the predetermined voltage and/or current limit profile in real time and based on calculations on data collected during operation of the lithium-ion cell.

23. The system of claim 14, wherein the one or more circuits are configured, when the enhanced algorithm is applied, to determine adjustments to voltage and/or current limits to maintain capacity of the lithium-ion cell at particular value relative to an initial capacity of the lithium-ion cell.

* * * * *